(12) United States Patent
Arimoto et al.

(10) Patent No.: US 7,014,722 B1
(45) Date of Patent: Mar. 21, 2006

(54) TITANIUM MATERIAL SUPERIOR IN UPSET-FORGEABILITY AND METHOD OF PRODUCING THE SAME

(75) Inventors: Nobuhiro Arimoto, Hyogo (JP); Tadashi Ogasawara, Hyogo (JP); Isao Uemura, Hyogo (JP); Youji Mitani, Hyogo (JP); Takashi Oonishi, Hyogo (JP)

(73) Assignee: Sumitomo Titanium Corporation, Amagasaki (JP)

( * ) Notice: Subject to any disclaimer, the term of this patent is extended or adjusted under 35 U.S.C. 154(b) by 318 days.

(21) Appl. No.: 10/048,974

(22) PCT Filed: Aug. 10, 2000

(86) PCT No.: PCT/JP00/05383

§ 371 (c)(1),
(2), (4) Date: Feb. 14, 2002

(87) PCT Pub. No.: WO01/12358

PCT Pub. Date: Feb. 22, 2001

(30) Foreign Application Priority Data

Aug. 16, 1999 (JP) .................................. 11-230113

(51) Int. Cl.
*C22C 14/00* (2006.01)
*C21D 8/10* (2006.01)

(52) U.S. Cl. ........................ 148/421; 148/670; 420/417

(58) Field of Classification Search ................. 148/670, 148/671, 421; 420/417

See application file for complete search history.

(56) References Cited

U.S. PATENT DOCUMENTS 5,026,520 A    6/1991   Bhowal et al. ............. 420/417

FOREIGN PATENT DOCUMENTS

| DE | 40 23 962 A1 | | 4/1991 |
|---|---|---|---|
| JP | 55-154640 | | 11/1980 |
| JP | 57-202935 | | 12/1982 |
| JP | 60-3936 | | 1/1985 |
| JP | 62-072448 | | 4/1987 |
| JP | 62-284053 | | 12/1987 |
| JP | 62-286640 | | 12/1987 |
| JP | 03-140447 | | 6/1991 |
| JP | 5-237581 | | 9/1993 |
| JP | 05237581 A | * | 9/1993 |
| JP | 08-081747 | | 3/1996 |
| JP | 8-232061 | | 9/1996 |
| JP | 08232061 A | * | 9/1996 |
| JP | 62-286639 | | 12/1997 |
| JP | 11-269621 | | 10/1999 |

* cited by examiner

*Primary Examiner*—Deborah Yee
(74) *Attorney, Agent, or Firm*—Westerman, Hattori, Daniels & Adrian, LLP

(57) ABSTRACT

In finifsh-cogging a high-purity titanium material into a cylindrical form as the final shape, if cylindrical cogging is performed in all stages of warm forging or if cylindrical cogging is performed in the initial stage of the warm forging, there is no need of peripherally restricting the cylindrical cogging material, so that even if longitudinal upset-forging is effected with an upsetting ratio of 2, the condition that the major diameter/minor diameter ratio of the section after forging is not more than 1.01 can be satisfied, developing superior upset-forgeability. This makes it possible, in producing disk-like targets for sputtering, to minimize cutting loss produced during the rolling and machining and to maximize the yield of products; therefore, the material can be widely used as a semiconductor material for electrodes and the like using a high-purity titanium material.

9 Claims, 7 Drawing Sheets

(a)

(b)

TITANIUM MATERIAL SUPERIOR IN UPSET-FORGEABILITY AND METHOD OF PRODUCING THE SAME

TECHNICAL FIELD

This invention relates to a titanium material excellent in upset forgeability and useful in producing targets for sputtering, various other wrought or processed products and so forth and to a method of producing the same. More particularly, it relates to a titanium material having a uniform forgeable structure and thus having characteristics such that a cross section infinitely close to a circle can be attained after upset forging under compression in the longitudinal direction, without peripherally restricting the cylindrical cogging material, and to a method of producing the same.

BACKGROUND ART

Metallic titanium materials have so far been used in a wide range of fields as structural materials owing to their high specific tensile strength, high corrosion resistance and other excellent characteristics. In particular, in the field of semiconductors where the integration degree has been markedly increased in recent years, the consumption of high-purity titanium materials is rapidly increasing to meet the demands from the fine pattern processing viewpoint since high-purity titanium materials have low resistance characteristics and high strength characteristics or since titanium nitride has barrier characteristics, for instance.

In cases where a high-purity titanium material is applied as a semiconductor material such as an electrode material, it is generally used as targets for sputtering and, in that case, the material is required to have a purity of not lower than 99.98%, without taking gaseous impurities into consideration.

In producing targets for sputtering, a forging material is subjected to cylindrical cogging and then to upset forging or axisymmetric rolling so that good sputtering characteristics can be secured and the working yield can be improved. More specifically, a titanium ingot (e.g. 730 mm φ) prepared by melting at a high purity is used as the material and subjected to two or more repetitions of the step of cylindrical cogging to a predetermined outside diameter (e.g. 165 mm φ). Then, the cogging is cut to a predetermined length and subjected to upset forging by compressing the same in the longitudinal direction to give a disk-shaped titanium material having a predetermined thickness. Then, for uniformly extending the thus-worked disk-shaped titanium material in radial directions, axisymmetric rolling is carried out to give a thinner disk-like shape (e.g. 25 mm thick). Thereafter, the disk is subjected to machine cutting and finishing to give desired targets for sputtering.

The metallographic structure of a titanium material may include the α phase close-packed hexagonal structure and the β phase body-centered cubic structure depending on the temperature conditions, and the transformation from the α phase to the β phase occurs at the β transformation point which is in the high temperature region. Meanwhile, among such metallographic structures, the body-centered cubic structure shows better workability as compared with the close-packed hexagonal structure but allows marked growth of crystal grains under high temperature conditions. Therefore, in working such material to give products, such as targets for sputtering, for which the growth of crystal grains and/or recrystallization is to be suppressed, it becomes necessary to control the working temperature therefor. In particular, the growth of crystal grains of high-purity titanium becomes more remarkable under high temperature conditions and, therefore, it becomes necessary to work at temperatures not higher than the β transformation point. Therefore, in cogging a cylindrical titanium material in the above-mentioned target manufacturing process, warm forging at temperatures not higher than the β transformation point is a prerequisite for suppressing the growth of crystal grains while securing a certain degree of workability.

FIG. 1 is a diagram illustrating the prior art warm forging process for cylindrically cogging a raw material ingot to a cylindrical final form. As shown in the figure, the cogging process from the raw material ingot (e.g. 730 mm φ) to a finish outside diameter of 165 mm φ includes 4 steps. In the prior art warm forging, even in the case of cogging to a cylindrical final shape, forging is carried out to a prism-like shape using flat molds in the middle stage of forging and thereafter, for example until the third step in which cogging is performed to a shape of 175 mm square.

In a typical forging process, a raw material ingot is uniformly heated in a heating furnace and then subjected to free forging using flat molds. As for typical means, the material is pressed in the vertical direction, then rotated by 90° or 270° and again pressed in the vertical direction. This procedure is repeated to give an intermediate material having a shape of 175 mm square. Thereafter, the four vertices of the intermediate material are respectively pressed to give an octagonal shape, and the resulting vertices are further pressed to a 16-sided figure, then to a 32-sided figure and so on, in a manner more and more approaching to a circle to finally give a cylindrical cogging with a finish outside diameter of 165 mm φ.

In manufacturing targets for sputtering, as mentioned above, cogging is performed to give a final cylindrical titanium material and this material is then cut to a predetermined length and then subjected to upset forging in the longitudinal direction to give a disk-shaped titanium material having a predetermined thickness. However, when cogging is performed in the prior art manner of warm forging, as shown in FIG. 1, the titanium material after upset forging cannot have a shape close to a circle but becomes irregular in deformation in radial directions.

FIG. 2 is a representation of irregularities in sectional deformation in radial directions as resulting from upset forging, FIG. 2 (a) showing a case of square deformation and (b) showing a case of elliptical deformation. In this instance, the cross section after upset forging has a major diameter or major axis portion $L_A$ and a minor diameter or minor axis portion $L_B$ and the ratio between them ($L_A/L_B$) is much greater than 1.0 and, thus, the cross section becomes quite different from a circular shape and the upset forgeability becomes worse. This tendency becomes more remarkable as the upsetting ratio increases.

In manufacturing targets for sputtering, the titanium material after upset forging is finished to a disk-like shape by axisymmetric rolling. However, it is difficult to correct the titanium material cross-section once given a shape differing from a circular one. If, therefore, the titanium material having a square or elliptical cross section is subjected as it is to target processing, great process losses will occur until final products are obtained and, accordingly, the yield of products will decrease markedly.

In some cases, high-speed forging is employed in cylindrical cogging by warm forging. For working of titanium, in particular, a type GFM high-speed forging machine has been developed. On this forge, a material is pounded simultaneously from four directions by means of four reciprocating hammers and the material to be forged is fed thereto by means of chuck heads provided before and after the hammers while being rotated.

However, when such high-speed forging is employed, the working force supplied by the molds, such as hammers, tends to fail to extend to the central portion of the material, leading to preferential working of the material surface. Thus, the so-called fish tail phenomenon may become significant, and the worked structure of the cogging also tends to become inhomogeneous and thus the cross section will show increased unevenness in grain size in radial directions. For such reasons, high-speed forging cannot be employed as means of working of targets for sputtering.

DISCLOSURE OF INVENTION

In cases where the prior art cogging step, which is carried out in the manner of warm forging as shown in FIG. 1, is employed in working targets for sputtering, significant working losses occur until final products are obtained, decreasing the yield of products, as mentioned above. When, on the other hand, high-speed forging is employed, there arises the problem that the quality required of targets cannot be secured.

The present invention, which has been made in view of the above-mentioned problems occurring in the step of cogging of titanium materials to be worked into targets for sputtering, has for its object to provide a titanium material having good upset forgeability and making it possible to secure a cross-sectional shape infinitely close to a circle in the step of upset forging which is carried out following the step of cylindrical cogging at a final finish outside diameter.

To achieve the above object, the present inventors made various investigations concerning the technology of warm forging of titanium materials and, as a result, found that the upset forgeability of a titanium material after cylindrical cogging is greatly influenced by the orientation of crystals in the cogging. In other words, this means that the working conditions (material temperature, method of working) in the step of warm forging greatly influence the orientation of crystals and are thus closely associated with the cross-sectional deformation in the subsequent step of upset forging. Further, they found that, for improving the upset forgeability of a cogging, it is necessary for the crystal orientation distribution to show regularity and, at the same time, it is necessary to reduce the dispersion of crystal grain sizes in radial directions from the central portion to the outer layer portion of the cogging.

For attaining uniform and regular orientation of crystals in a cogging, it is necessary to take the direction of working and working conditions into consideration from the initial stages of working involving warm forging so that the crystal orientation required of the final cogging can be attained. Specifically, in the main stage or stages of warm forging, the cogging is worked to a shape similar to the final cross-sectional shape thereof and, at the same time, the working force is caused to uniformly extend to the central portion of the material.

For achieving this, it is effective to perform cylindrical cogging in all the stages from the start to the end of warm forging or to perform cylindrical cogging at least in the initial stage or stages of warm forging prior to finish cogging to a cylindrical form as the final shape. Further, it is also possible to secure the desired upset forgeability by performing polygonal forging (e.g. octagonal forging), which resembles cylindrical cogging, in all stages of warm forging.

In particular when cylindrical cogging is carried out in all stages of warm forging or at least in the initial stage thereof, the use of round molds as the forging tools is effective.

FIG. 3 illustrates an example of the round mold to be employed in the practice of the present invention. The round mold according to the invention is constituted of a pair of upper and lower mold parts forming an elliptical hole. A heated material is inserted into this hollow. While the material is moved in the longitudinal direction, it can be uniformly cogged in the manner of free forging by pressing from the upper and lower directions by means of an air hammer, steam hammer or hydraulic press. When the round mold shown in FIG. 3 is used, the titanium material according to the invention can be worked to a shape similar to the final shape and, at the same time, the working force can be caused to uniformly extend to the central portion of the material, whereby the material can show excellent upset forgeability.

The present invention, which has now been completed based on the above findings, consists in the following (1) titanium material and (2) method of producing titanium materials:

(1) A titanium material cogged by warm forging to a cylindrical form as the final shape, which material is excellent in upset forgeability so that when upset forging for compressing the material in the longitudinal direction is performed at an upsetting ratio of 2, the major/minor axis ratio of the section after forging does not exceed 1.10.

It is desirable that when upset forging is carried out at an upsetting ratio of 4, the above titanium material give a cross-sectional major/minor axis ratio of not more than 1.05 after forging.

(2) A method of producing titanium materials excellent in upset forgeability by finish cogging to a cylindrical form as the final shape in the manner of warm forging, which method comprises performing cylindrical cogging in all stages of the warm forging or performing cylindrical cogging in the initial stage(s) of the warm forging.

In the above production method, the warm forging is desirably carried out by heating the material to be forged to a temperature within the range not lower than 300° C. but not higher than the β transformation point. Further, it is desirable that the cylindrical cogging in warm forging be performed in the manner of free forging using a round mold.

It is also desirable that the titanium material referred to above under (1) and (2) be a high-purity titanium material having a purity of not lower than 99.98% except for gaseous impurities.

In accordance with the present invention, the upset forgeability is judged based on whether the requirement that the sectional major/minor axis ratio after forging at an upsetting ratio of 2 should be not more than 1.10 is satisfied or not. This is because according to the results of investigations made by the present inventors, the reduction in yield of products, namely targets, as caused by the shape of the cogging can be avoided if such upset forgeability can be secured. The "sectional major/minor axis ratio" so referred to herein is represented by the ratio $(L_A/L_B)$ between the major axis $L_A$ and minor axis $L_B$ of the section after upset forging as shown in FIG. 2.

Whereas, generally, as the upsetting ratio increases, the major/minor axis ratio increases and the upset forgeability tends to become worse, the present invention attempts to establish a definite standard by employing the upsetting ratio of 2 as a precondition. As shown later in the example section, it is more desirable that, in addition to satisfaction of the requirement that the standard major/minor axis ratio should be not more than 1.10, the requirement that the major/minor axis ratio under the condition that the upsetting ratio is 4 should be not more than 1.05 be also satisfied, since, then, the upset forgeability can be secured with more certainty.

The titanium material according to the invention is produced by warm forging of a high-purity titanium material. The above-mentioned requirement that the high-purity titanium material should have a purity of not lower than 99.98% except for gaseous impurities is based on the purity required when the material of the invention is used in preparing targets for sputtering. The reason why the heating temperature in warm forging should be not higher than the β transformation point (about 880° C.) is that since the growth of crystal grains at higher temperatures in high-purity titanium becomes more remarkable, such growth of crystal growth should be suppressed. The lower limit of heating is set at 300° C. so that the forgeability can be established.

BEST MODES FOR CARRYING OUT THE INVENTION

Figure 3:
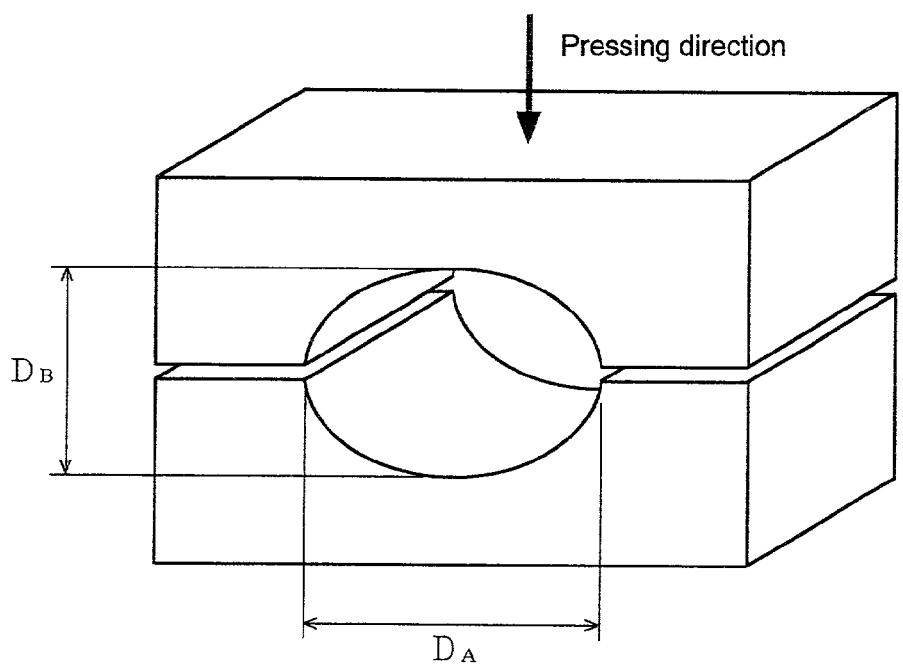
FIG. 3 is a view showing an example of the round mold employed in the present invention.
Figure 4:
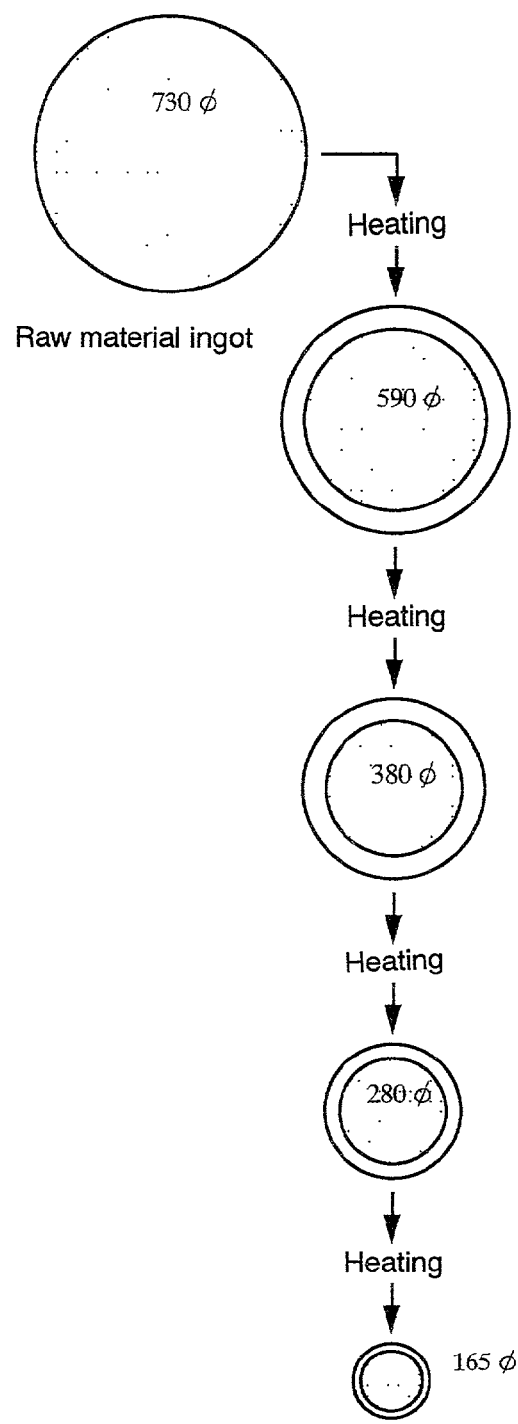
FIG. 4 is a diagram illustrating a process for working a titanium material according to the invention in which cylindrical cogging is performed in all stages of warm forging.

FIG. 4 is a diagram illustrating a process for working a titanium material according to the invention in which cylindrical cogging is performed in all stages of warm forging. As shown in the figure, the process includes 4 divided stages of cylindrical forging until a cogging having a final outside diameter is obtained. Each stage of cylindrical cogging is performed in the manner of free forging using such a round mold as shown in FIG. 3. High-speed forging, however, cannot be employed as the method of forging in practicing the present invention, since, as mentioned above, it tends to give an inhomogeneous worked structure to the resulting cogging.

The round mold mentioned above forms a hole or hollow portion with a major axis (major diameter) $D_A$ and a minor axis (minor diameter) $D_B$ as a result of combination of the upper and lower mold parts. However, since the diameter of the material that can be worked on that mold and the final diameter attainable thereon are determined by the shape of the hole of the round mold, it is necessary to change the round mold from one to another having a smaller hole one by one from the diameter of the starting material to the final finish outside diameter.

In the first step, an ingot having a diameter of 730 mm φ is used as the starting material and, after heating for warm forging, this is cogged to 590 mm φ using a round mold. In this step, a round mold having a hole with a size of $D_A$ 800 mm and $D_B$ 590 mm can be used.

Then, in the second step, a round mold having a different hole size is used and the material is cogged to 380 mm φ. In the subsequent third step, cogging is performed to 280 mm φ using another round mold. Thereafter, in the fourth step, cogging is performed using a further round mold to give a finally finished cogging with 165 mm φ. Here, in the first to fourth steps, cogging is performed while appropriately heating the material between steps in a heating furnace so that the temperature of the titanium material may be maintained in the range of 850 to 500° C. Since the length of the titanium material is increased with the progress of cogging, cogging is performed while appropriately cutting the material to a length easy to handle under working conditions.

In cylindrical cogging using round molds, it is necessary to work the material to a shape similar to the final one and, at the same time, cause the working force to uniformly extend to the central portion of the material so that the cylindrical titanium material to be finally finished can have good upset forgeability with certainty. For this purpose, it is necessary to restrict the draft or reduction per stroke in the upward and downward directions (per press) to a level not heavier than 25% relative to the diameter of the material prior to reduction. This is because if the reduction per stroke (press) is in excess of 25%, the working force can no longer be uniformly transmitted.

Figure 5:
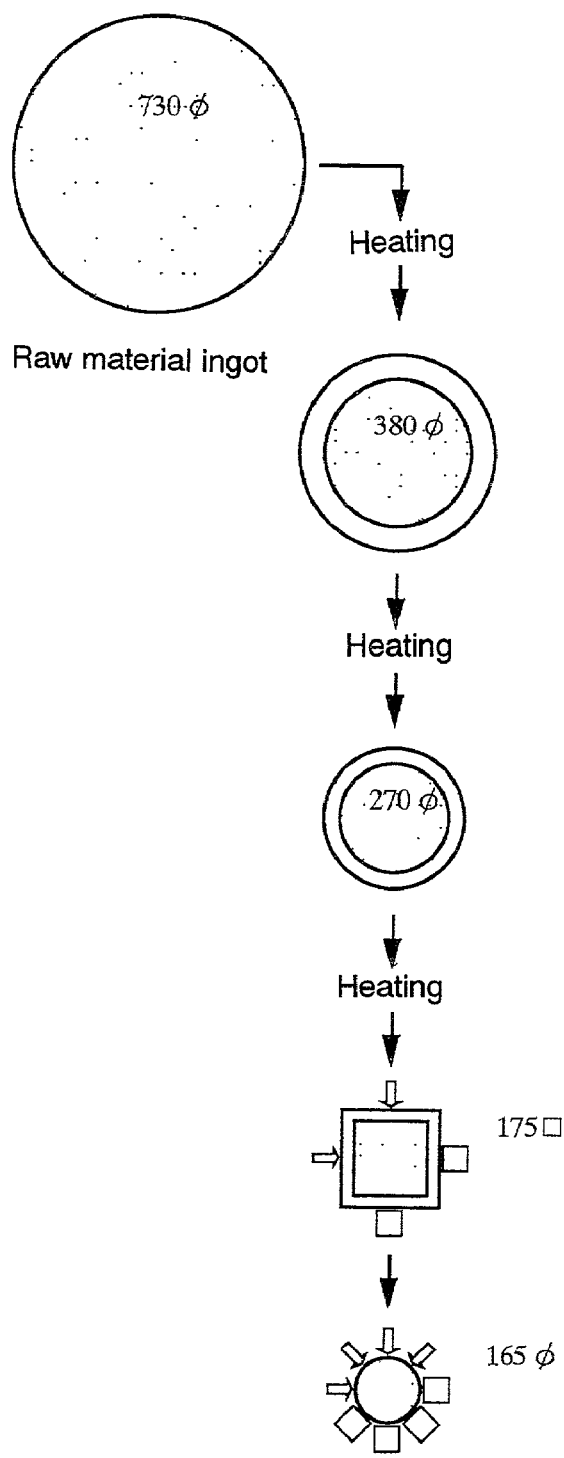
FIG. 5 is a diagram illustrating a process for working a titanium material according to the invention in which cylindrical cogging is performed in the initial main stage or stages of warm forging.

FIG. 5 is a diagram illustrating a process for working a titanium material according to the invention in which cylindrical cogging is performed in the initial main stage or stages of warm forging. More specifically, in the first and second steps, after warm heating, cylindrical cogging is performed using such round molds as the one shown in FIG. 3, to 380 mm φ in the first step and to 270 mm in the second step. Thereafter, in the third step, square forging is performed using a flat mold to 175 mm square and, thereafter, in the fourth step, the material is worked using a round mold to give a finally finished 165 mm φ cogging.

The disposition of crystals toward orientation tends to be formed in the initial stage of working. Therefore, for securing the upset forgeability with the cylindrical titanium material to be finally finished, it is efficient to render the disposition of crystals toward orientation uniform and regular in the initial stage or stages of warm forging.

Investigations made by the present inventors have revealed that a sufficient level of upset forgeability can be secured by performing cylindrical cogging using round molds within the period from the start of forging to the time when the reduction in area reaches at least 70%, desirably 80%, although any specific technological grounds have not been found as yet. The period from the start of forging to the time when the reduction in area reaches 80%, for instance, corresponds to the degree of working for cogging a starting material with 730 mm φ, for instance, to about 330 mm φ.

Figure 6:
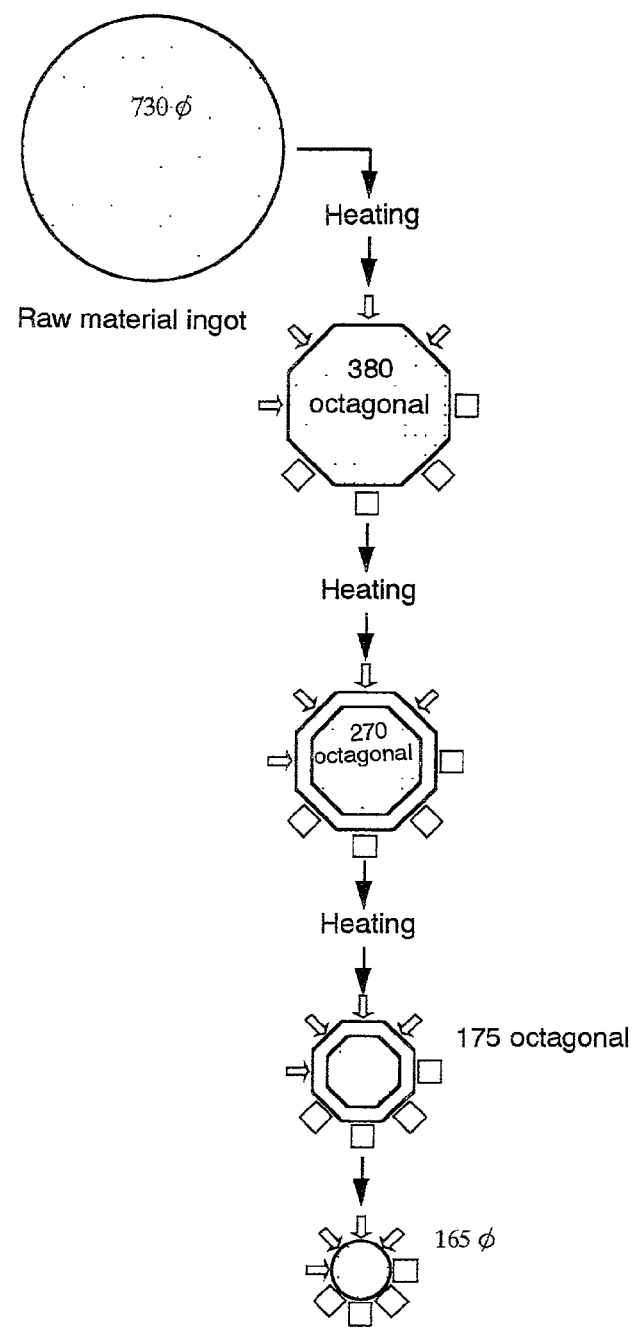
FIG. 6 is a diagram illustrating a process for working a titanium material according to the invention in which polygonal cogging is performed in all stages of warm forging.

FIG. 6 is a diagram illustrating a process for working a titanium material according to the invention in which polygonal cogging is performed in all stages of warm forging. In the figure, the case of octagonal forging is shown as an example of polygonal cogging. In addition, 16-gonal or 32-gonal forging can also be employed. In performing octagonal forging, too, the process comprises four divided stages of forging.

In the first step, an as-case ingot having a diameter of 730 mm φ is used as the starting material and, after warm heating, it is cogged to a 380 mm octagonal form using a flat mold while rotating the material by 90° or 270° and further by 45° or 135°. Then, in the second step, the warm-heated material is cogged to a 270 mm octagonal form. In the subsequent third step, after warm heating, cogging is performed to a 175 mm φ octagonal form using a flat mold. Thereafter, in the fourth step, working is made using a round mold to give a finally finished 165 mm φ cogging.

Any cogging method employed from among the warm forging methods shown in FIGS. 4 to 6 can give a titanium material excellent in upset forgeability that the present invention intends to provide. Thus, when the titanium material cogged to a final outside diameter is cut to a required length, heated to a predetermined temperature and subjected to upset forging, a nearly disk-like product showing a sectional major/minor axis ratio of not higher than 1.10 can be obtained after forging. By using this in manufacturing targets, it is possible to markedly reduce the machine working loss and markedly improve the yield of products.

EXAMPLES

The characteristics of the titanium material of the present invention are explained based on some typical examples in each of which a high-purity titanium material was used. The purity of the titanium material used in each example was 99.995% except for gaseous impurities.

Example 1

According to the warm forging process shown in FIG. 4, a cylindrical titanium material was cogged using round molds. The starting material used was a VAR-melted ingot with a diameter of 730 mm φ x a length of 2,500 mm. In the first step, after uniform heating at 850° C. in a heating furnace, cogging was performed to 590 mm φ, to 380 mm φ in the second step, and to 280 mm φ in the third step. Then, in the fourth step, cogging was performed to the finish outside diameter of 165 mm φ using a round mold. Through the first step to the fourth step, uniform heating was conducted between steps to enable warm working at a material temperature of 850 to 500° C. The cogging works were performed while cutting the cogging, on appropriate occasions, to a length enabling easy handling in working.

The titanium material cogged to the finish outside diameter was cut to a predetermined length (e.g. 200 mm), and the cut pieces were heated at 600° C. in a heating furnace for 2 hours and then subjected to upset forging in the longitudinal direction at an upsetting ratio of 2 (length after forging 100 mm) or an upsetting ratio of 4 (length after forging 50 mm). The results of measurement for upset forgeability, namely sectional major/minor axis ratio after forging, as obtained on that occasion are shown below in Table 2.

The titanium material cogged to the finish outside diameter was evaluated also in the light of the pole figure of the (0002) crystal face by X ray transmission. The X ray transmission method employed in the examples was carried out under the conditions shown below in Table 1.

TABLE 1

X ray transmission test conditions (1) Sampling site
    Specimen plates, 1 mm thick and 50 mm square, are collected from the central portion of the material.
(2) Specimen preparation method
    The thickness is adjusted to 30 to 25 μm by chemical polishing.
(3) Measurement method
    X ray diffraction intensities are measured and a whole pole figure is prepared for (0002), (10-10).
(4) Measurement conditions
    X ray measurement apparatus: Product of Rigaku Denki/X ray diffraction apparatus (model Ru-200B)
    Target: Co
    Voltage and current: 53 kV, 150 mA In the examples, the "(0002) face parallel to the closest packed plane" was taken as the target of evaluation. This is because since α titanium has the hexagonal close-packed structure at the β transformation point and below, as mentioned above, the direction of orientation of crystals can be judged by specifying the (0002) face. The judgment criterion on that occasion is "that the pole figure shows no concentration in a plurality of portions and shows a pattern of concentric circles". This is because since the deformation of titanium having the hexagonal close-packed structure is mostly accounted for by slip deformation in the <11–20> direction, the deformation in the C axis cannot be obtained by the activity of the slip system. In cases where the (0002) face is concentrated in a plurality of portions, there must be deviations in the C axis direction, hence deformation due to deviations in slip deformation occurs.

Figure 7:
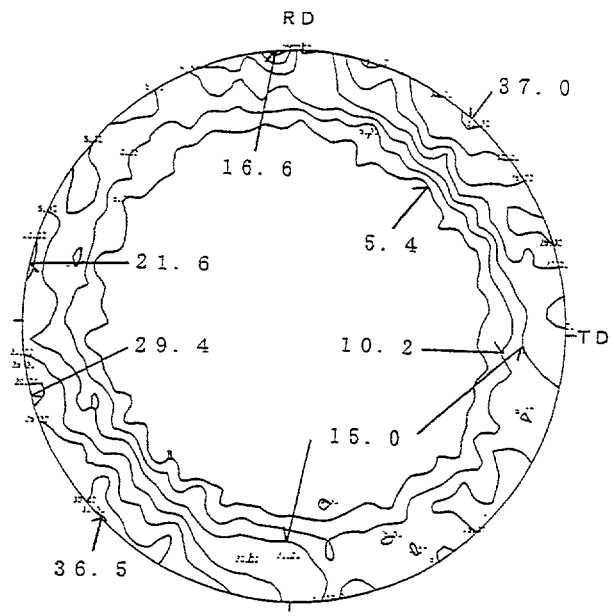
FIG. 7 is a representation of a pole figure of the (0002) crystal face as recorded in Example 1 by X ray transmission.

Therefore, the pole figure of the (0002) crystal face as obtained by X ray transmission was evaluated in Example 1. The results are shown in FIG. 7 and Table 2. Furthermore, the radial crystal grain size distribution was measured by the section method according to ASTM E-112. The result is shown in Table 2.

Example 2

According to the warm forging process shown in FIG. 5, a titanium material was worked to a cylindrical form as the final shape by cylindrical cogging using round molds in combination with square cogging using flat molds. The starting material used was the same as the one used in Example 1. In the first step, after heating at 850° C. in a heating furnace, cogging was performed to 380 mm φ using a round mold, and to 270 mm φ in the second step using a round mold. Thereafter, in the third step, square cogging was performed to 175 mm square using a flat mold. Then, in the fourth step, cogging was performed to the finish outside diameter of 165 mm φ using a round mold. Through the first step to the fourth step, uniform heating was conducted between steps to enable warm working at a material temperature of 850 to 500° C. The cogging works were performed while cutting the cogging, on appropriate occasions, to a length enabling easy handling in working.

The titanium material cogged to the finish outside diameter was subjected to forging at an upsetting ratio of 2 or an upsetting ratio of 4 in the same manner as in Example 1, and the sectional major/minor axis ratio was measured, the crystal face pole figure was evaluated by X ray transmission and, further, the crystal grain size distribution was measured.

The results thus obtained are shown below in Table 2.

Example 3

According to the warm forging process shown in FIG. 6, a titanium material was worked to a cylindrical form as the final shape by performing octagonal cogging in all stages. The starting material used was the same as the one used in Example 1. In the first step, after heating at 850° C. in a heating furnace, cogging was performed to 380 mm octagonal using a flat mold, to 270 mm octagonal in the second step using a round mold, and to 175 mm octagonal in the third step using a flat mold. In the fourth step, cogging was performed to the finish outside diameter of 165 mm φ using a round mold. Through the first step to the fourth step, uniform heating was conducted between steps to enable warm working at a material temperature of 850 to 500° C. The cogging works were performed while cutting the cogging, on appropriate occasions, to a length enabling easy handling in working.

The titanium material cogged to the finish outside diameter was subjected to forging at an upsetting ratio of 2 or an upsetting ratio of 4 in the same manner as in Example 1, and the sectional major/minor axis ratio was measured, the crystal face pole figure was evaluated by X ray transmission and, further, the crystal grain size distribution was measured. The results thus obtained are shown below in Table 2.

Comparative Example

Figure 1:
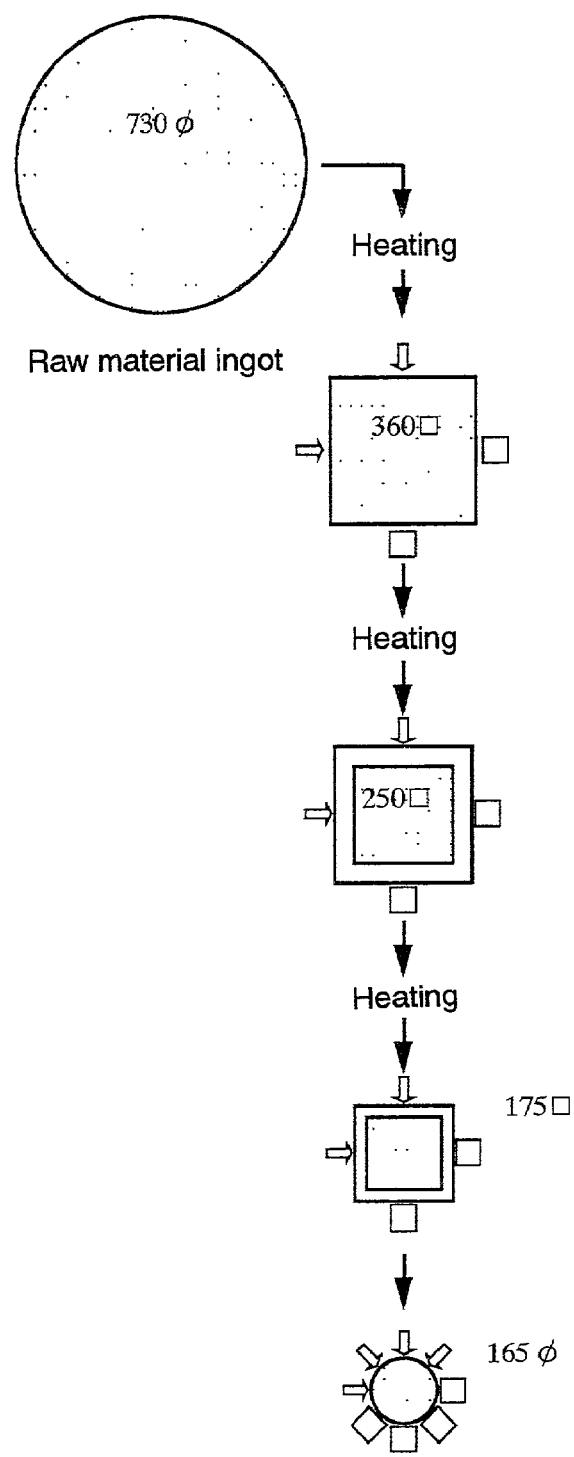
FIG. 1 is a diagram illustrating the prior art warm forging process for cogging a raw material ingot to a cylindrical form as the final shape.
Figure 2:
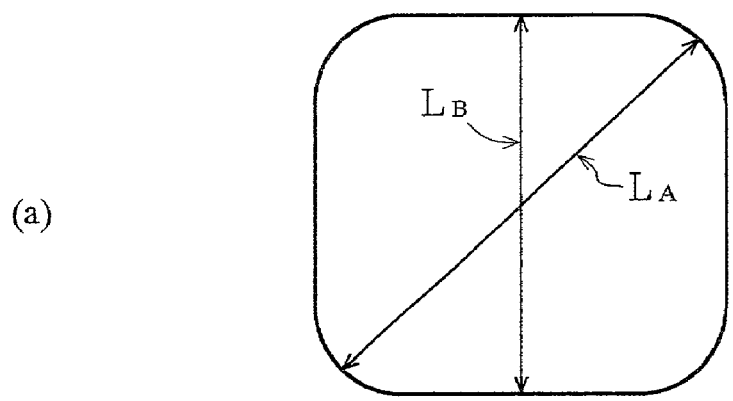
FIG. 2 is a representation of two examples of irregular sectional deformation in radial directions in upset forging.
Figure 2:
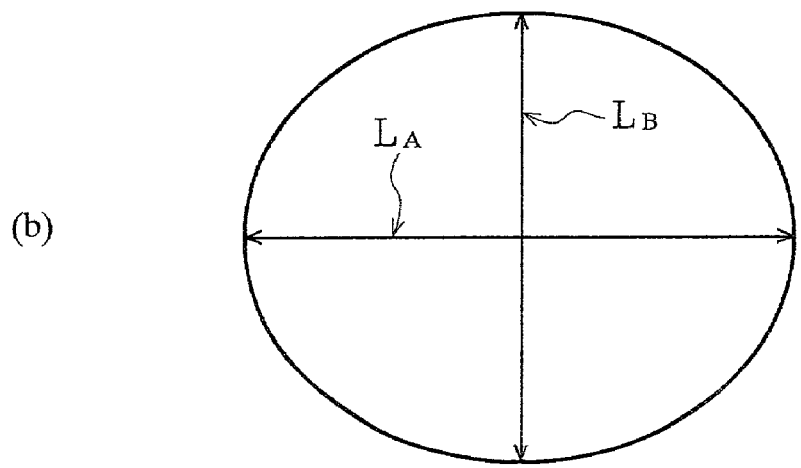

According to the warm forging process shown in FIG. 1, a titanium material was worked to a cylindrical form as the final shape by square cogging using flat molds. Like in Example 1, the starting material used was a VAR-melted ingot with a diameter of 730 mm φ x length of 2,500 mm. In the first step, after heating at 850° C. in a heating furnace, cogging was performed to 360 mm square, to 250 mm square in the second step, and to 175 mm square in the third step. In the fourth step, cogging was performed to the finish outside diameter of 165 mm φ using a round mold. Through the first step to the fourth step, uniform heating was conducted between steps to enable warm working at a material temperature of 850 to 500° C. The cogging works were performed while cutting the cogging, on appropriate occasions, to a length enabling easy handling in working.

The titanium material cogged to the finish outside diameter was subjected to forging at an upsetting ratio of 2 or an upsetting ratio of 4 in the same manner as in Example 1, and the sectional major/minor axis ratio was measured, the crystal face pole figure was evaluated by X ray transmission and, further, the crystal grain size distribution was measured. The results thus obtained are shown below in Table 2. The crystal face pole figure obtained by X ray transmission is shown in FIG. 8.

TABLE 2

| | Measurement and evaluation results | | | |
|---|---|---|---|---|
| | Forging section major/minor axis ratio | | Pole figure evaluation | * Crystal |
| Examples | Upsetting ratio 2 | Upsetting ratio 4 | by X ray transmission | grain size ASTM E-112 |
| 1 Example 1 | 1.02 | 1.03 | *◎ | 9 μm |
| 2 Example 2 | 1.03 | 1.05 | ◎ | 9 μm |
| 3 Example 3 | 1.05 | 1.07 | ○ | 10 μm |
| 4 Comparative | 1.13 | 1.21 | *X | 13 μm |

Figure 8:
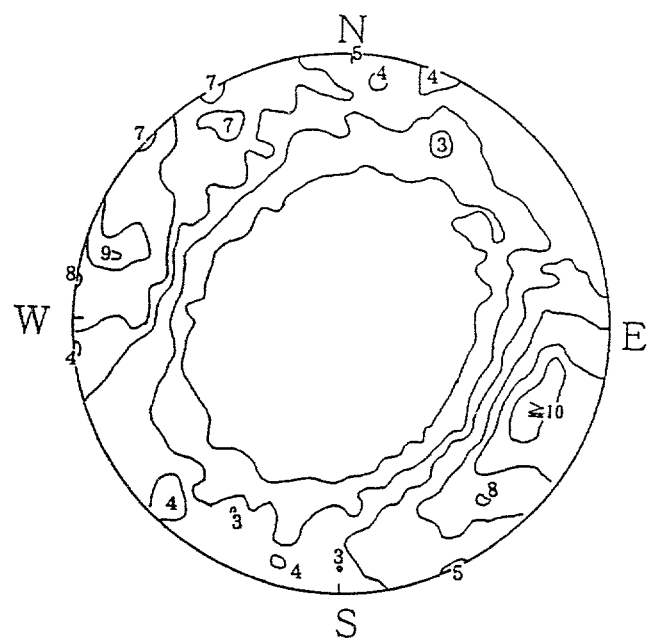
FIG. 8 is a representation of a pole figure of the (0002) crystal face as recorded in Comparative Example by X ray transmission.

*1) Among the results of evaluation by X ray transmission, the pole figures obtained in Example 1 and Comparative Example are shown in FIG. 7 and FIG. 8, respectively.
*2) The crystal grain size is expressed in terms of standard deviation in grain size dispersion.

(Comparison of Measurement Results and of Evaluation Results)

The sectional major/minor axis ratio as measured after upset forging was satisfactorily not more than 1.10 in each case in Examples 1 to 3, whereas that ratio was 1.13 in the comparative example even at an upsetting ratio of 2. Although, at an upsetting ratio of 4, there is a tendency toward increase in major/minor axis ratio, it is seen that the upset forgeability is excellent. In particular, in Examples 1 and 2, the requirement that the ratio should be not more than 1.05 was satisfied even at an upsetting ratio of 4.

According to the results of crystal face pole figure evaluation by X ray transmission, a tendency was seen in the comparative example toward localization in orientation distribution on the (0002) face parallel to the closest packed plane, as shown in FIG. 8. In Examples 1 to 3, on the other hand, it could be confirmed that the orientation distribution on the (0002) face parallel to the closest packed plane is not localized but shows concentricity. In the pole figure in Example 1, taken as a typical example, a concentric distribution can be seen, as shown in FIG. 7, without relative concentration in a plurality of portions on the (0002) face parallel to the closest packed plane.

According to the results of crystal grain size measurement, the dispersion of the crystal grain size between the surface layer and central portion of the titanium material is 9 to 10 μm, as expressed in terms of standard deviation, in Examples 1 to 3, whereas, in the comparative example, the crystal grain size dispersion is worse, namely 13 μm as expressed in terms of standard deviation.

As is evident from the above-mentioned results, the titanium materials worked in Examples 1 to 3 each has a uniform forged structure over the whole length and whole section of the cogging and can show excellent upset forgeability.

INDUSTRIAL APPLICABILITY

According to the titanium material and production method of the present invention, the requirement that the sectional major/minor axis ratio after forging should be not higher than 1.10 can be satisfied even when upset forging is performed in the longitudinal direction at an upsetting ratio of 2, without peripherally restricting the cylindrical cogging material, hence excellent upset forgeability can be manifested. This makes it possible, in producing disk-like targets for sputtering, to minimize the cutting losses during rolling and machining and markedly improve the yield of products; therefore, the material can be widely used as a high-purity titanium electrode material.

The invention claimed is:

1. A titanium material cogged by warm forging to a cylindrical form as the final shape, the titanium material having a (0002) face showing a concentric pole figure, wherein said material has an excellent upset forgeability, wherein the titanium material has a major/minor axis ratio of the section of 1.10 or less at an upsetting ratio of 2, wherein the upsetting ratio is a ratio compressed in the longitudinal direction.

2. A titanium material as claimed in claim 1, wherein the titanium material further has a major/minor axis ratio of the section of 1.05 or less at an upsetting ratio of 4.

3. A titanium material as claimed in claim 1 or 2 which has a purity of not less than 99.98% except for gaseous impurities.

4. A method of producing a titanium material having an excellent upset forgeability, comprising the steps of:
   providing a titanium ingot;
   initially subjecting the titanium ingot to warm forging by means of a mold selected from the group consisting of round mold, octagonal mold, 16-gonal mold and 32-gonal mold, so as to reduce a cross section of the titanium ingot by 70% or more;
   finally subjecting the reduced titanium ingot to warm forging by means of a final round mold to obtain the titanium material shaped into a cylindrical form; and
   compressing the titanium material in the longitudinal direction at an upsetting ratio of 2, to show a major/minor axis ratio of the section of 1.10 or less.

5. A method of producing titanium materials as claimed in claim 4, wherein the material to be forged has a purity of not less than 99.98% except for gaseous impurities.

6. A method of producing titanium materials as claimed in claim 4, wherein the warm forging is performed by heating the material to be forged to a temperature within the range from 300° C. up to the β transformation point.

7. A method of producing titanium materials as claimed in any one of claims 4, 5 and 6, wherein the cylindrical cogging in the warm forging is performed in the manner of free forging using a round mold or round molds.

8. A method of producing titanium materials as claimed in claim 5, wherein the warm forging is performed by heating the material to be forged to a temperature within the range from 300° C. up to the β transformation point.

9. A method of producing titanium materials as claimed in claim 8, wherein the cylindrical cogging in the warm forging is performed in the manner of free forging using a round mold or round molds.

* * * * *